(12) United States Patent
McCarthy

(10) Patent No.: US 6,227,878 B1
(45) Date of Patent: May 8, 2001

(54) METHOD AND APPARATUS FOR IMPROVING RF CONTACT POSITIONING IN AN RF TEST SOCKET

(75) Inventor: Evan S. McCarthy, Costa Mesa, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/360,586

(22) Filed: Jul. 26, 1999

(51) Int. Cl.[7] ................................................. H01R 12/00
(52) U.S. Cl. ............................ 439/83; 439/70; 439/525; 439/586; 439/924.2
(58) Field of Search ............................... 439/526, 70, 72, 439/525, 592, 593, 586, 924.2, 83, 71

(56) References Cited

U.S. PATENT DOCUMENTS

| | | |
|---|---|---|
| 4,528,500 | 7/1985 | Lighbody et al. . |
| 4,571,542 | 2/1986 | Arai . |
| 4,850,883 * | 7/1989 | Kabadi ................................. 439/67 |
| 4,936,783 * | 6/1990 | Petersen ............................... 439/70 |
| 5,228,189 | 7/1993 | Driller . |
| 5,580,262 * | 12/1996 | Kubota et al. ....................... 439/189 |
| 5,734,176 | 3/1998 | Oldfield . |

* cited by examiner

Primary Examiner—Paula Bradley
Assistant Examiner—Truc Nguyen
(74) Attorney, Agent, or Firm—Meredith Martin Addy Brinks Hofer Gilson & Lione

(57) ABSTRACT

A method and apparatus for improving RF contact positioning in a RF test socket is disclosed. The RF test socket comprises a housing having a plurality of notches along one side for clamping to a RF test board and postioning a plurality of contacts in the notches between the housing and the RF test board. The plurality of notches are formed in a step fashion wherein when the housing is clamped to the RF test board, the housing deflects such that the plurality of contacts contact the RF test board with equal force. The plurality of notches are lower in a center of the housing and higher along the edges thereby defining a catenary shape of notches along the housing and are further machined to a specific height for applying equal force or the plurality of contacts.

19 Claims, 2 Drawing Sheets

METHOD AND APPARATUS FOR IMPROVING RF CONTACT POSITIONING IN AN RF TEST SOCKET

BACKGROUND OF THE INVENTION

1. Field of the Invention

The present invention relates to improvements in RF socket designs and in particular to a method and apparatus that improves RF contact positioning in an RF test socket.

2. Description of Related Art

An RF (Radio Frequency) test socket, for measuring RF electronic components may be designed using a plastic housing and gold-plated contacts. The plastic housing is clamped down onto a test board, sandwiching the contacts between the test board and the plastic housing. Due to deflection in the plastic housing the contacts next to the holding screws are held tightly while the contacts near the center of the span are loose. Currently a piece of elastomer is placed in a machined groove between the housing and the contacts for applying pressure to pins for alignment purposes. However, the use of the elastomer does not in some cases allow for good electrical contact when clamping the test board to the plastic housing due to deflections in the housing and use of an elastomer.

Therefore a need exists for clamping the housing of a RF test socket to a RF test board such that deflections in the plastic still allow for good electrical contact. Additionally, a need exists for removing the use of an elastomer thereby providing a design solution requiring fewer components. The present invention solves this problem in a new and unique manner not previously known in the arts.

SUMMARY OF THE INVENTION

The RF test socket comprises a housing having a plurality of notches along one side for clamping to an RF test board and postioning a plurality of contacts in the notches between the housing and the RF test board. The plurality of notches are formed in a step fashion wherein when the housing is clamped to the RF test board, the housing deflects such that the plurality of contacts contact the RF test board with equal force. The plurality of notches are lower in a center of the housing and higher along the edges thereby defining a catenary shape of notches along the housing and are further machined to a specific height for applying equal force on the plurality of contacts.

BRIEF DESCRIPTION OF THE DRAWINGS

The exact nature of the invention itself, as well as a preferred mode of use, its objects and advantages, will best be understood by reference to the following detailed description when read in conjunction with the accompanying drawings, in which like reference numerals designate like parts throughout the figures thereof, wherein.

DETAILED DESCRIPTION OF THE PREFERRED EMBODIMENTS

The following description is provided to enable any person skilled in the art to make and use the invention and sets forth the best modes contemplated by the inventor of carrying out his invention. Various modifications, however, will remain readily apparent to those skilled in the art.

Figure 1:
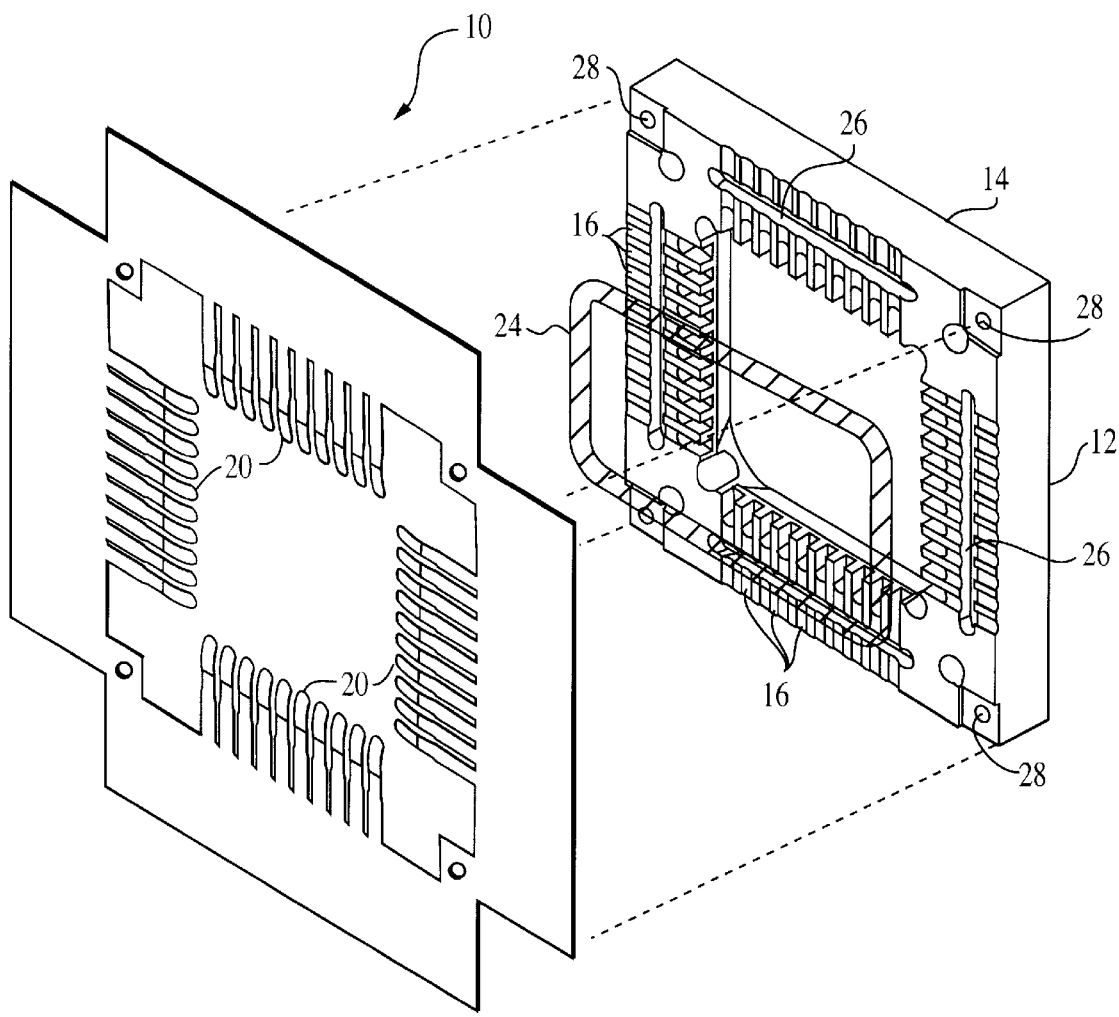
FIG. 1 is an isometric view of a prior art RF test socket and RF test board.

Referring now to the drawings, FIG. 1 shows a prior art test configuration for measuring RF electronic components. As shown in FIG. 1, An RF (Radio Frequency) socket 12, for measuring RF electronic components may be designed using a plastic housing 14 and notches 16. The plastic housing 14 is clamped down onto a RF test board 18, sandwiching the contacts 20 between the test board 18 and the plastic housing 14 and into the notches 16. Due to deflection in the plastic housing 14, the contacts 20 in the notches 16 next to holding screws (not shown) placed through the screw holes 22 are held tightly while the notches 16 near the center of the span are loose. The reason the contacts 20 in the notches 16 in the center of the RF test socket 12 are loose is due to deflection in the plastic housing 14 when it is clamped down. A piece of elastomer 24 is placed in machined grooves 26 within plastic housing 14 between the plastic housing 14 and the contacts 20 in the notches 16. This elastomer 24 applies pressure to alignment dole pins (not shown) through alignment pin holes 28, keeping them in place.

Figure 2:
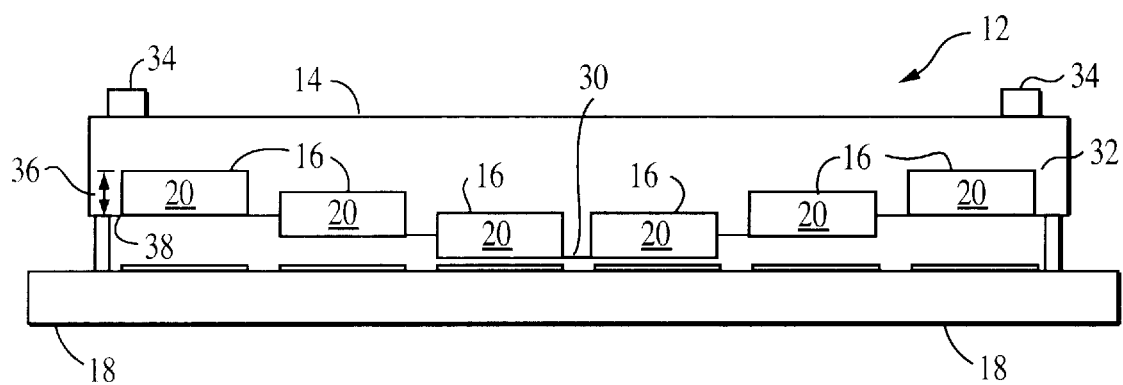
FIG. 2 is a side elevation of an RF test socket in accordance with the present invention before being clamped to an RF test board.
Figure 3:
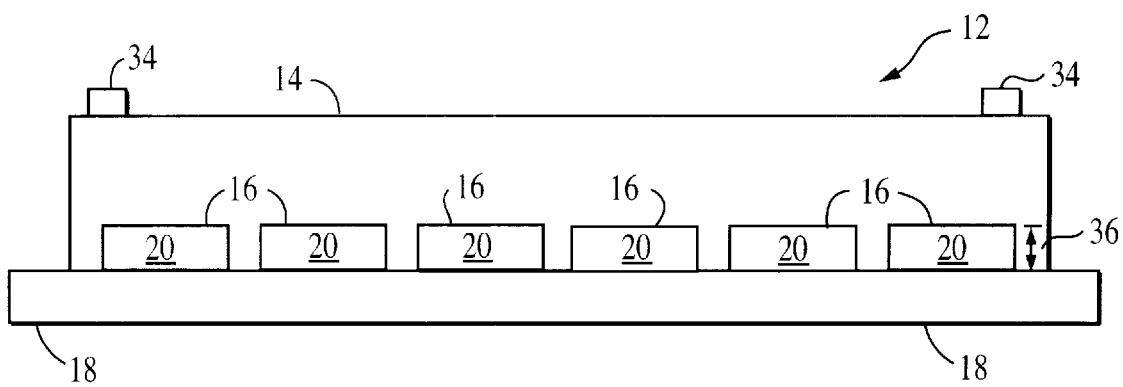
FIG. 3 is a side elevation of the RF test socket of FIG. 2 clamped to a RF test board in accordance with the present invention.

Referring now to FIGS. 2 and 3, in accordance with the present invention, the RF test socket 12 has its notches 16 machined in such a way that the center 30 is lower than the edges 32 where the RF test socket 12 will be clamped. This means that as the plastic housing 14 is clamped down using clamping screws 34 it deflects and all of the contacts 20 in the notches 16 touch the RF test board 18, as shown in FIG. 3. In order to assure that each contact 20 in a notch 16 is held with the same force, the depth 36 of each notch 16 is machined to a specific depth to take into the consideration of the plastic housing's deflection. As shown in FIG. 2, if the RF test socket 12 is the shape of a simple beam, the notches 16 would line up to shape a catenary. This is the same shape that a chain takes when it is suspended at two ends.

Therefore, in accordance with the present invention, the housing 14 has a plurality of notches 16 along one side 38 of the housing 14 for clamping to the RF test board 18 wherein a plurality of contacts 20 are postioned in the notches 16. As shown by FIG. 2, the plurality of notches 16 are formed in a step fashion wherein when the housing 14 is clamped to the RF test board 18, the housing deflects such that the plurality of contacts 20 in the notches 16 touch the RF test board. The housing 12 may be made of any suitably flexible material, but is preferably made of plastic. The housing 12 has a predetermined height wherein when the housing 12 is clamped to the RF test board 18, the housing 18 allows sufficient deflection for the plurality of contacts 20 to touch the RF test board 18.

The plurality of notches 16 are machined to a specific height or depth for applying and equal force on the plurality of contacts 20. It should be understood that the specific heights machined are able to change the catenary shape to increase or decrease the force applied to the plurality of contacts 20 when the housing 12 and the RF test board 18 are clamped together. The plurality of contacts 18 are gold-plated for electrical connection and the housing has a plurality of holding screws 34 for clamping to the RF test board 18 with equal force. By using the stepped notch design of the present invention, the prior art requirement to use an elastomer is eliminated thereby reducing the number of components required to build the test assembly.

While the invention has been particularly shown and described with reference to a preferred embodiment, it will be understood by those skilled in the art that various changes in form and detail may be made therein without departing from the spirit and scope of the invention.

Those skilled in the art will appreciate that various adaptations and modifications of the just-described preferred embodiments can be configured without departing from the scope and spirit of the invention. Therefore, it is to be understood that within the scope of the appended claims, the invention may be practiced other than as specifically described herein.

What is claimed is:

1. An RF test apparatus for improving RF contact positioning, comprising:
    a housing having a plurality of notches formed in a step fashion along one side of the housing, wherein the plurality of notches are formed in the housing to be lower in a center of the housing and higher in a direction away from the center of the housing;
    a plurality of contacts, each contact being fitted into one of the notches; and
    an RF test board, wherein when said housing is clamped onto said RF test board, the housing deflects such that the plurality of contacts in the notches all contact the RF test board.

2. The RF test apparatus of claim 1 wherein
    the housing is made of plastic.

3. The RF test apparatus according to claim 1, wherein the plurality of notches are formed in the housing in a step fashion to define a catenary shape along the housing.

4. The RF test apparatus according to claim 3, wherein each of the plurality of notches is machined to a specific height for applying an equal force on the contacts when the housing and the RF test board are clamped together.

5. The RF test apparatus according to claim 4, wherein the specific heights are machined to change the catenary shape to increase the force applied to the plurality of contacts when the housing and the RF test board are clamped together.

6. The RF test apparatus according to claim 4, wherein the specific heights are machined to change the catenary shape to decrease the force applied to said plurality of contacts when said housing and RF test board are clamped together.

7. The RF test apparatus according to claim 1, further comprising:
    a plurality of holding screws in the housing for clamping the housing to the RF test board with equal force.

8. The RF test apparatus according to claim 1, further comprising
    gold plating on the plurality of contacts.

9. A method for improving RF contact positioning, the steps of the method comprising:
    forming a plurality of notches in a step fashion along one side of a housing, wherein the plurality of notches are formed in the housing to be lower in a center of the housing and higher in a direction away from the center of the housing;
    postioning a plurality of contacts into the notches in the housing; and
    clamping the housing to the RF test boards wherein the housing deflects such that the plurality of contacts in the notches contact the RF test board.

10. The method according to claim 9, wherein the housing is made out of plastic.

11. The method according to claim 10, wherein the forming a plurality of notches steps further comprises:
    defining the plurality of notches to be lower in a center of the housing.

12. The method according to claim 9, wherein the forming a plurality of notches step further comprises:
    defining a catenary shape for the plurality of notches along the housing.

13. The method of claim 12, wherein the forming a plurality of notches step further comprises:
    machining each one of the plurality of notches to a specific height for applying an equal force on the plurality of the contacts when the housing and the RF test board are clamped together.

14. The method according to claim 13, wherein the forming a plurality of notches step further comprises:
    machining the specific heights to change the catenary shape to increase a force applied to the plurality of contacts when the housing and the RF test board are clamped together.

15. The method according to claim 13, wherein the forming a plurality of notches step further comprises:
    machining the specific heights to change the catenary shape to decrease a force applied to said plurality of contacts when said housing and said RF test board are clamped together.

16. The method according to claim 9, further comprising:
    clamping the housing with a plurality of holding screws to the RF test board with equal force.

17. The method according to claim 9, further comprising gold-plating the plurality of contacts.

18. An RF test apparatus for improving RF contact positioning, comprising:
    a plastic housing having a plurality of notches formed in a step fashion along one side, wherein the plurality of notches are formed in the housing to be lower in a center of the housing and higher in a direction away from the center of the housing;
    a plurality of contacts, each contact being fitted into one of the notches; and
    an RF test board.

19. The RF test apparatus according to claim 18 wherein each of the notches is machined to a specific height for applying an equal force on the contacts when the housing and the RF test board are clamped together.

* * * * *